United States Patent [19]

Crowe

[11] Patent Number: 5,661,624
[45] Date of Patent: Aug. 26, 1997

[54] FOLDBACK CURRENT LIMITING OF A TELEPHONE LINE SWITCH

[75] Inventor: Kevin Anthony Crowe, Bangor, Australia

[73] Assignee: Alcatel Australia Ltd., Sydney, Australia

[21] Appl. No.: 219,491

[22] Filed: Mar. 28, 1994

[30] Foreign Application Priority Data

Apr. 8, 1993 [AU] Australia ................... PL8235

[51] Int. Cl.⁶ ........................................ H02H 3/18
[52] U.S. Cl. .................. 361/79; 361/119; 361/101
[58] Field of Search .................. 361/18, 79, 93, 361/98, 100–101, 107, 119; 379/2; 307/116, 130–131

[56] References Cited

U.S. PATENT DOCUMENTS

| | | | |
|---|---|---|---|
| 3,577,035 | 5/1971 | Constable | 361/79 |
| 4,180,768 | 12/1979 | Ferraro | 323/9 |
| 4,603,234 | 7/1986 | Huet et al. | 379/379 |
| 4,623,950 | 11/1986 | Palara et al. | 361/79 |
| 4,800,331 | 1/1989 | Vesce et al. | 323/277 |
| 4,893,252 | 1/1990 | Blumel | 364/483 |
| 4,914,542 | 4/1990 | Wagoner | 361/98 |
| 5,005,008 | 4/1991 | King | 340/653 |
| 5,041,940 | 8/1991 | Sullivan | 361/18 |

FOREIGN PATENT DOCUMENTS

| | | |
|---|---|---|
| 0393333 | 10/1990 | European Pat. Off. . |
| 0529633 | 3/1993 | European Pat. Off. . |
| 3538088 | 4/1987 | Germany . |
| 9007213 | 6/1990 | WIPO . |

OTHER PUBLICATIONS

Patent Abstracts of Japan, vol. 12, No. 127 (E–602) Apr. 20, 1988 & JP-A-62 253 252 (NEC Corp) Nov. 5, 1987.

Patent Abstracts of Japan, vol. 12, No. 127 (E–602), Apr. 20, 1988 and Japanese Patent Application JP-A-62 253 252 (NEC Corp). Nov. 5, 1987.

"Adding foldback resistor provides overload safety" by W.J. Riley, Electronics Designer's Casebook, vol. 14D, approx. 1973, McGraw–Hill Inc., New York, NY, p. 20.

Primary Examiner—Jeffrey A. Gaffin
Assistant Examiner—Michael J. Sherry
Attorney, Agent, or Firm—Ware, Fressola, Van Der Sluys & Adolphson LLP

[57] ABSTRACT

A telephone having a semiconductor line switch TR1 is protected from excess line voltage or current by the use of current foldback techniques. A current sensing resistor R6, in series with the line switch provides a measure of the line current and this operates a bypass transistor TR4 which reduces the drive current for the line switch TR1 causing it to come out of saturation and begin to block line current. A voltage sensing resistor R7 provides a measure of the voltage across TR1 and this further increases the bypass current through TR4. This ensures that the voltage and current applied to TR1 remain within permitted limits.

12 Claims, 4 Drawing Sheets

FOLDBACK CURRENT LIMITING OF A TELEPHONE LINE SWITCH

BACKGROUND OF THE INVENTION

1. Field of the Invention

This invention relates to the protection of telephones from faults causing excessive current and power dissipation.

2. Description of Related Art

When the handset of a telephone is lifted, a line switch inside the telephone closes and allows current from the exchange to flow through the telephone. Modern telephones, especially hands-free telephones, often use a semiconductor (such as a bipolar or field effect transistor) to provide the switching of the current. With normal exchange battery voltages and feed impedances, the semiconductor switch remains saturated when closed and very little power is dissipated in the switch. During abnormal conditions such as an exchange ring trip failure or earth fault, an excessive level of current may flow through the telephone and damage the components of the telephone. If a semiconductor switch is used, the overload can be detected and the semiconductor switch can be used to limit the current to a predetermined level.

A problem with this arrangement is that the semiconductor line switch will come out of saturation and a significant voltage drop appears across the semiconductor line switch. Although the current has been limited to a safe level, the power dissipated by the line switch is the product of this current and the voltage drop across the line switch. The power level can easily exceed the rating of the semiconductor line switch and cause a failure of the semiconductor line switch.

SUMMARY OF THE INVENTION

An object of the present invention is to prevent such failures.

According to the present invention, a telephone subset having a first semiconductor line switch includes a control circuit for controlling the operation of the line switch, the control circuit including current sensing means for sensing the line current and voltage sensing means for providing a measure of the voltage across the line switch, the control means for ensuring that the combination of the line current and the voltage across the line switch remains within a permitted range.

In further accord with the present invention, such is ensured by foldback current limiting. The circuit may be arranged such that the current limit is not fixed, but is dependent on the voltage across the line switch. As the overload condition increases the voltage drop across the line switch increases but the current through the line switch will initially limit and then decrease. With this arrangement, not only is the current limited but the power dissipation is also limited. Correct selection of the values in the circuit ensure that the line switch remains within its published safe operating area.

According further to the present invention, component values selected to limit the current and power dissipation must ensure that the worst case exchange feed load line cuts the DC characteristic of the phone at one point only. Otherwise a latchup condition may result and the phone will not reliably seize the exchange line.

In still further accord with the present invention, the line switch current may drop to zero during a large overload, a non-linear protection device (such as a varistor) may be required to protect the line switch from voltage overloads which exceed the Vceo of the line switch.

These and other objects, features and advantages of the present invention will become more apparent in light of the following detailed description of a best mode embodiment thereof, as illustrated in the accompanying drawing.

DESCRIPTION OF PREFERRED EMBODIMENTS OF THE INVENTION

Figure 1:
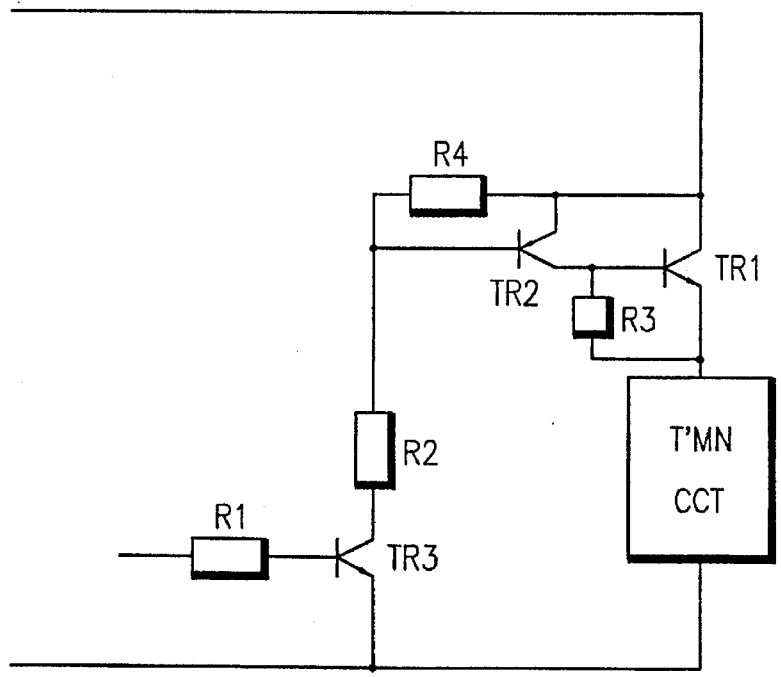
FIG. 1 shows a first line switch without current limiting, according to the prior art.
Figure 4:
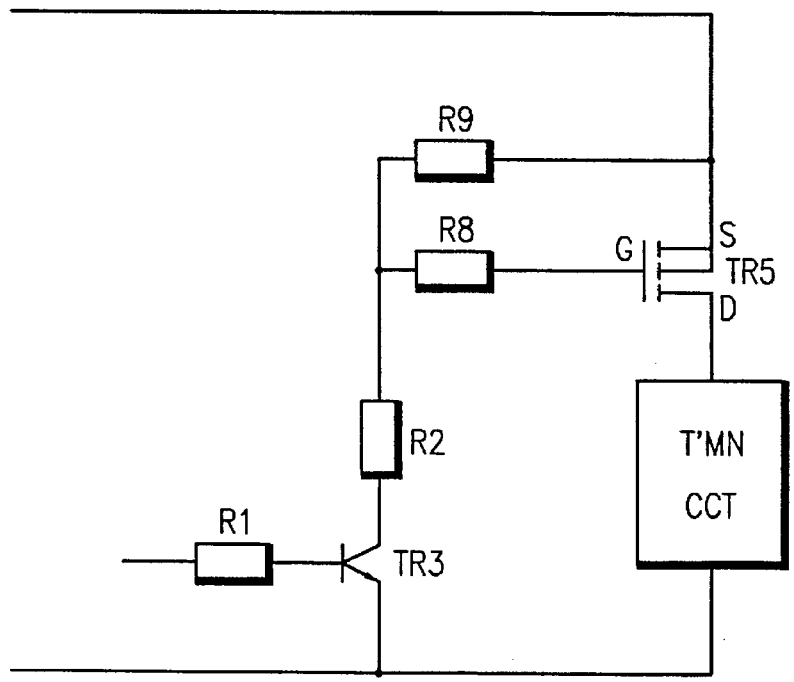
FIG. 4 shows a second line switch without current limiting, according to the prior art.

FIGS. 1 and 4 show line switches using a bipolar transistor and a field effect transistor respectively.

FIG. 1 shows a prior art configuration where TR1 switches the line current to the phone transmission circuit. The bridge rectifier between the switch and line is not shown. TR3 is turned on by the dialler (not shown) when the phone goes on line. TR3 then switches TR2 on and TR2 turns on TR1. R3 and R4 provide a path for leakage currents to avoid spurious operation of TR1 and TR2. R2 limits the base current of TR2. With this configuration, the current flowing through TR1 during an overload condition (eg. a surge on the line) is not limited.

Figure 2:
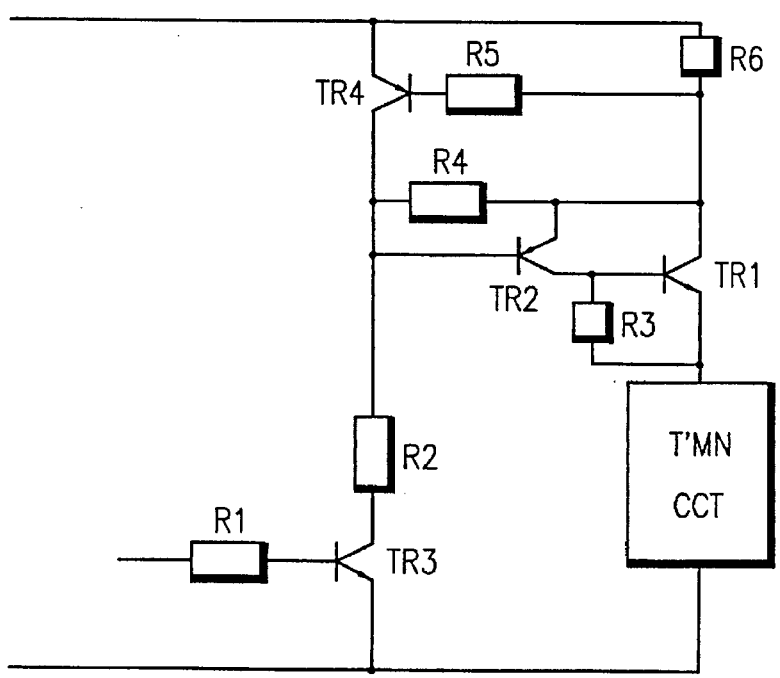
FIG. 2 shows the first line switch with normal current limiting, according to the prior art.

FIG. 2 shows the addition of R6, R5 and TR4 to provide a current limit for TR1, according to the prior art. R6 is a small value resistor which senses the current flowing through TR1. When the current flowing through TR1 reaches the current limit, the voltage across R6 turns on TR4.

When TR4 turns on it robs TR2 of base current. TR2 then provides less drive to TR1, causing TR1 to reduce the line current.

The current limit is set by the value of R6 and the $V_{be}$ of TR4. The current limit virtually is independent of the voltage across the line. R5 limits the base current of TR4.

Figure 3:
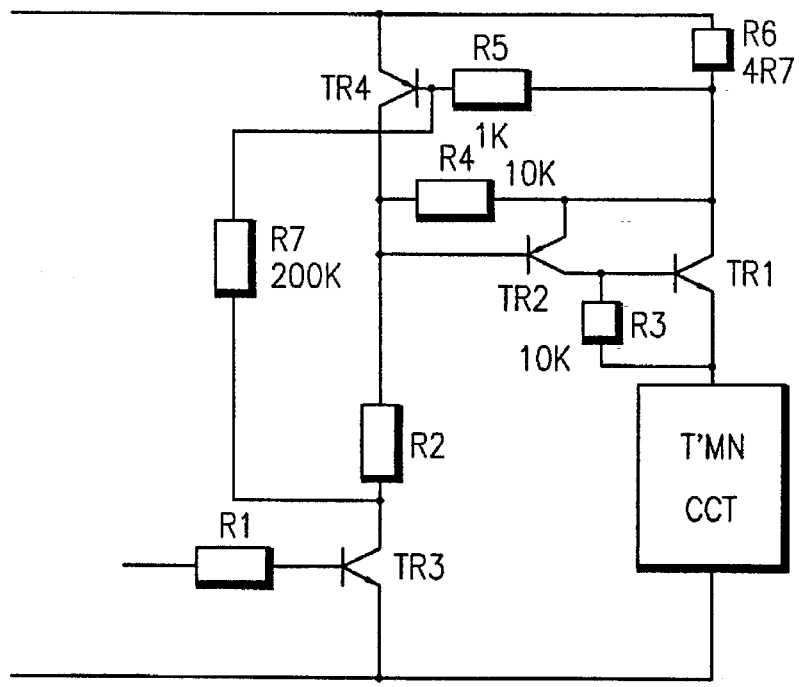
FIG. 3 shows the first line switch with foldback current limiting, according to the present invention.

FIG. 3 shows the addition of R7 to provide a fold back current limit, according to the invention. R7 provides extra base current to TR4. This base current is dependent on the line voltage. The higher the line voltage the greater the base current of TR4. The effect of this is that the current limit threshold is now dependent on the line voltage as well as R6 and the $V_{be}$ of TR4. As the line voltage increases, the current limit is reduced.

In normal operation TR1 is saturated and has a voltage drop $V_{CE}$ of about 0.5 V. R6 is a small resistor whose voltage drop is proportional to the line current through TR1. The phone transmission circuit has voltage limiting means (eg. a zener in parallel with the transmission circuit) which limit the voltage across transmission circuit, VT, to eg. 12 V.

During an overload condition where the line voltage may rise to eg. 70 V, TR1 comes out of saturation due to the current limiting and most of the line voltage VL appears across the line switch, as VS.

Thus:

$$VS=VL-VT-VR6$$

Under overload conditions both TR4 and TR3 are switched on so that most of VL appears across R7.

Thus the voltage across R7 is an indication of the voltage across TR1 under overload conditions.

While R7 is shown as connected to the collector of TR3, it could equally be connected to the line on the other side of TR3, i.e. the emitter of TR3. However, connecting R7 to the collector of TR3 saves leakage current through R7 when TR3 is OFF, i.e. the phone is off line.

FIG. 4 shows a line switch using a field effect transistor (FET), according to the prior art. A FET has the advantage of an insignificant drive current requirement.

FIG. 4 shows a basic line switch without current limiting. When the phone goes on line, the dialler turns on TR3. TR3 causes the gate-source voltage of TR5 to increase which turns on TR5. Line current flows through TR5 and into the phone transmission circuit.

Figure 5:
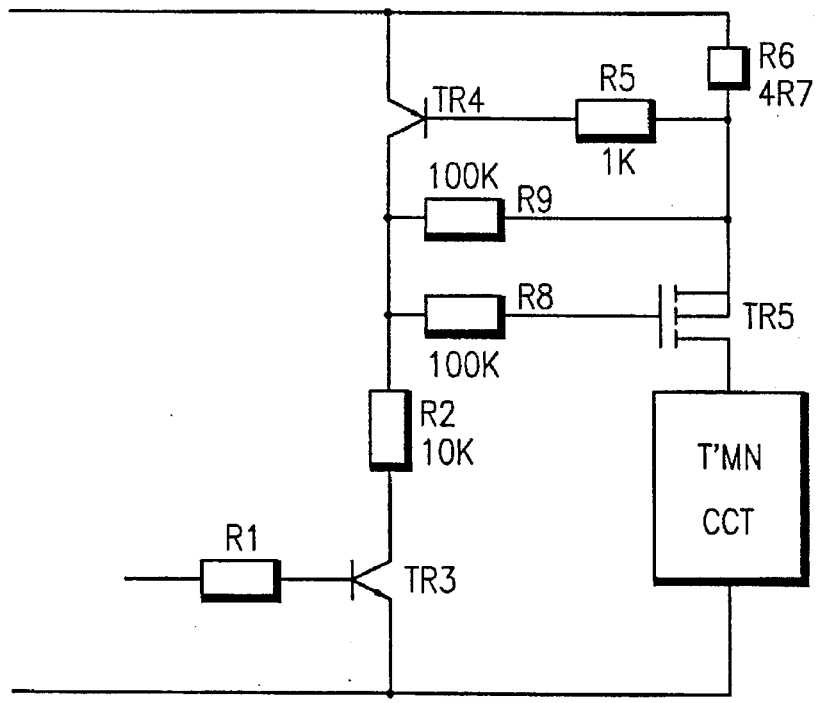
FIG. 5 shows the second line switch with normal current limiting.

FIG. 5 shows the addition of TR4, R5 and R6 to provide a current limit for TR5. R6 is a small valve resister which senses the current flowing through TR5. When the current flowing through TR5 reaches the current limit, the voltage across R6 turns on TR4. When TR4 turns on it reduces the gate-source voltage of TR5, causing TR5 to reduce the line current. The current limit is set by the value of R6 and the $V_{be}$ of TR4. The current limit is independent of the voltage across the line.

Figure 6:
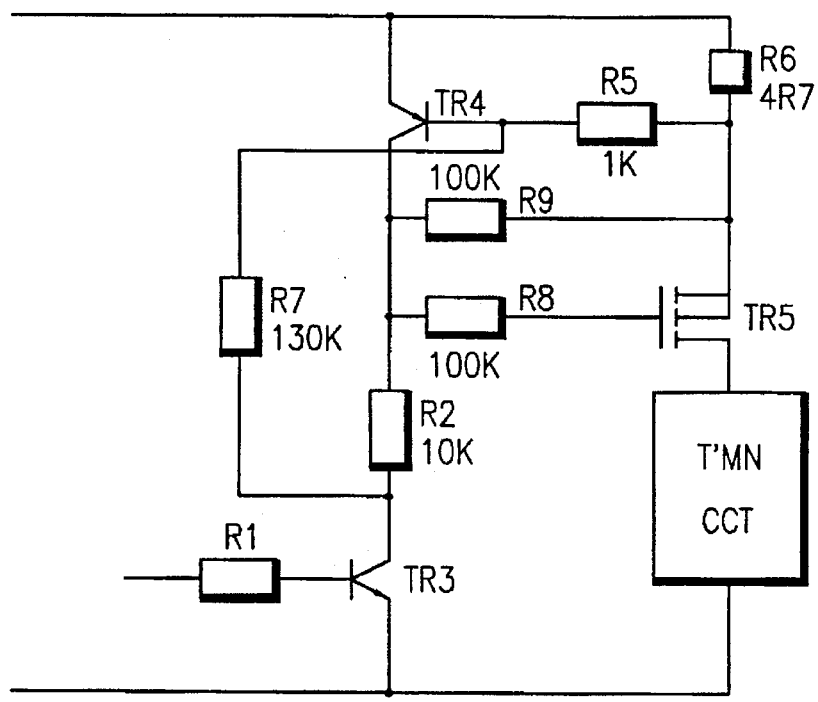
FIG. 6 shows the second line switch with fold back current limiting, according to the present invention.

FIG. 6 shows the addition of R7 to provide a foldback current limit. R7 provides extra base current for TR4. This base current is dependent on the line voltage. The higher the line voltage, the greater the base current of TR4. The effect of this is that the current limit threshold is now dependent on the line voltage as well as R6 and the $V_{be}$ of TR4. As the line voltage increases, the current limit is reduced.

Figure 7:
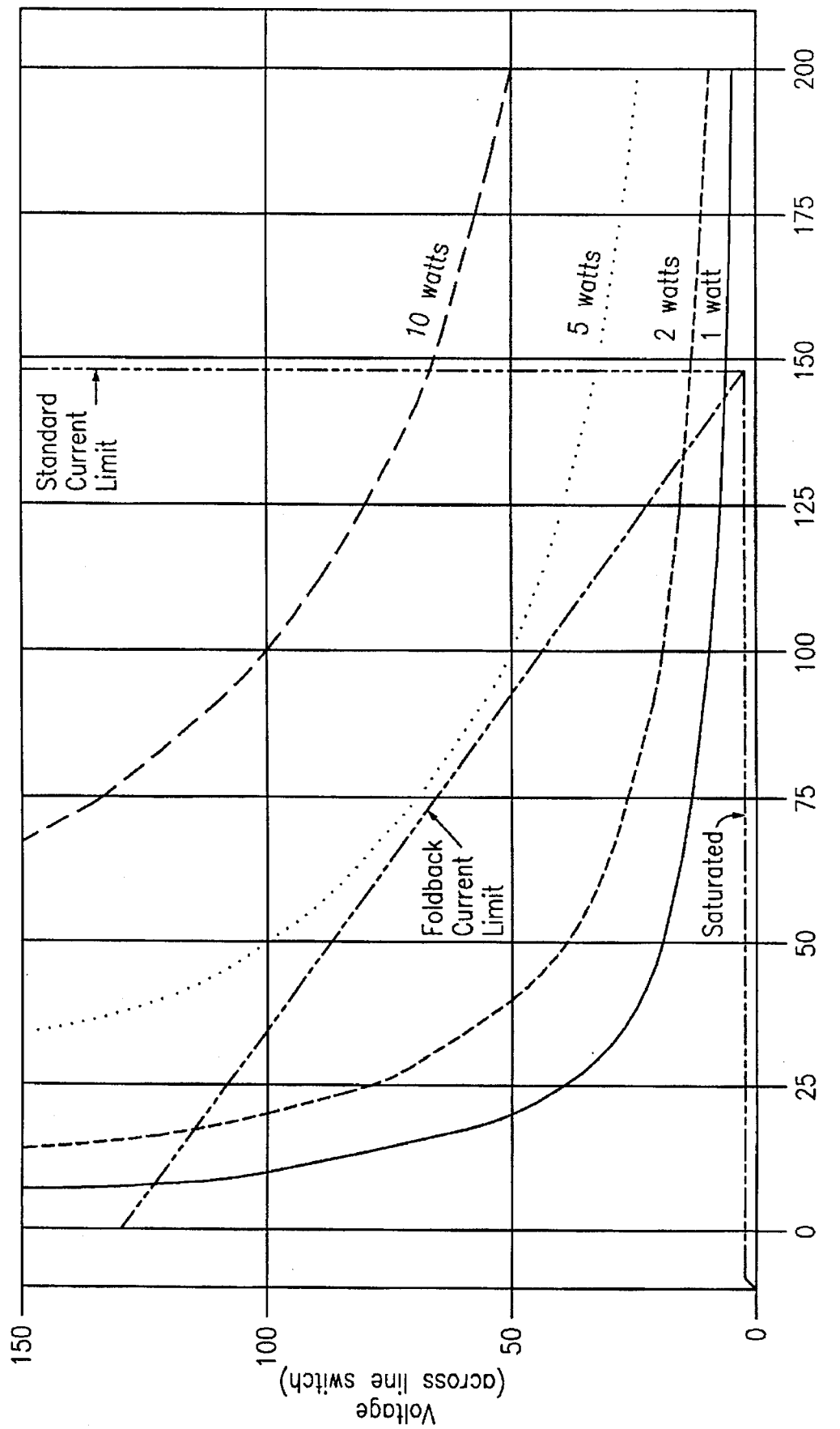
FIG. 7 shows a current versus voltage relationship for a semiconductor line switch, according to the present invention.

The graph of FIG. 7 shows the relationship of voltage across a line switch versus current through the line switch. The curved lines are lines of constant power. The "Standard Current Limit" can be seen to limit the transistor current (to approximately 145 mA in this example) but does not limit the power dissipation. In excess of 10 watts would be dissipated with line surges of 100 volts or more.

The "Foldback Current Limit" maintains the current below 150 mA as well as ensuring the power dissipation is below 5 watts. The "Saturated" line is the normal mode of operation for the line switch when on line, ie. less than 1 volt across the transistor for all currents up to 150 mA. In this mode the power dissipation is less than ¼ of a watt.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

I claim:

1. A telephone subset having a first semiconductor line switch and a control circuit to control the operation of the line switch, the control circuit including current sensing means to sense the line current and voltage sensing means to provide a measure of the voltage across the line switch, the control means acting to ensure that the combination of the line current and the voltage across the line switch remains within a permitted range, wherein the control means includes a first transistor responsive to an ON LINE signal to switch on and to cause a second transistor to switch on and to turn on the line switch, a third transistor controlled by the current sensing means to reduce the current through the second transistor when the line current reaches a threshold current, the reduction in current through the second transistor causing the line switch to come out of saturation and limit the line current, wherein the voltage sensing means provides additional control current for the third transistor when the voltage across the phone line exceeds a voltage threshold.

2. A subset as claimed in claim 1 wherein the current sensing means comprises a low value resistor in series with the line switch and connected between the emitter and base of the third transistor.

3. A subset as claimed in claim 2 wherein the voltage sensing means comprises a high value resistor connected between the base of the third transistor and the transmission circuit via the first transistor.

4. A subset as claimed in claim 2 wherein the line switch is a bipolar transistor, wherein the first and third transistors are connected in series across the series connection of the line switch and transmission circuit, wherein the base of the second transistor is connected between the first and third transistors, and wherein the emitter collector path of the second transistor bridges the collector base path of the line switch.

5. A subset as claimed in claim 1 wherein the line switch is a field effect transistor wherein the control means includes a first bipolar transistor in series with a third bipolar transistor across the series connection of the line switch and transmission circuit, wherein the current sensing means is a low value resistor connected across the emitter and base of the third bipolar transistor, wherein the voltage sensing means is a high value resistor connecting the base of the third transistor to the transmission circuit.

6. A subset as claimed in claim 5, wherein the high value resistor is connected to the transmission circuit via the first transistor.

7. A subset as claimed in claim 1 wherein the voltage sensing means comprises a high value resistor connected between the base of the third transistor and the remote side of the transmission circuit.

8. A subset as claimed in claim 7 wherein the line switch is a bipolar transistor, wherein the first and third transistors are connected in series across the series connection of the line switch and transmission circuit, wherein the base of the second transistor is connected between the first and third transistors, and wherein the emitter collector path of the second transistor bridges the collector base path of the line switch.

9. A subset as claimed in claim 1 wherein the line switch is a bipolar transistor, wherein the first and third transistors are connected in series across the series connection of the line switch and transmission circuit, wherein the base of the second transistor is connected between the first and third transistors, and wherein the emitter collector path of the second transistor bridges the collector base path of the line switch.

10. A subset as claimed in claim 1, wherein the high value resistor is connected to the remote side of the transmission circuit via the first transistor.

11. A method of protecting a telephone subset having a semiconductor line switch, the method including:

sensing the line current;

sensing the voltage across the semiconductor line switch;

producing a control signal from a combination of the results of sensing the line current and sensing the voltage across the line switch;

using the control signal to confine the operation of the line switch to within a permitted range by causing the semiconductor line switch to come out of saturation and limit the line current and providing additional control currents when the sensed voltage across the semiconductor line switch exceeds a voltage threshold.

12. A method of protecting a telephone subset having a semiconductor line switch, the method including:

means for sensing the line current;

means for sensing the voltage across the semiconductor line switch;

means for producing a control signal from a combination of the results of sensing the line current and sensing the voltage across the line switch; and means for using the control signal to confine the operation of the line switch to within a permitted range by causing the semiconductor line switch to come out of saturation and limit the line current and providing additional control currents when the sensed voltage across the semiconductor line switch exceeds a voltage threshold.

* * * * *